United States Patent [19]

Borth et al.

[11] Patent Number: 4,887,050

[45] Date of Patent: Dec. 12, 1989

[54] FREQUENCY CONTROL APPARATUS AND METHOD FOR A DIGITAL RADIO RECEIVER

[75] Inventors: David E. Borth, Palatine; James F. Kepler, Northbrook, both of Ill.

[73] Assignee: Motorola, Inc., Schaumburg, Ill.

[21] Appl. No.: 331,557

[22] Filed: Mar. 31, 1989

[51] Int. Cl.$^4$ .............................................. H03L 7/00
[52] U.S. Cl. ...................................... 331/34; 331/12; 329/318
[58] Field of Search .................... 331/11, 12, 17, 25, 331/34; 329/122, 124; 455/260

[56] References Cited

U.S. PATENT DOCUMENTS

| | | |
|---|---|---|
| 4,099,125 | 7/1978 | Bennett, Jr. et al. . |
| 4,188,582 | 2/1980 | Cannalte et al. . |
| 4,286,223 | 8/1981 | Shearer . |
| 4,291,269 | 9/1981 | Nossen . |
| 4,328,587 | 5/1982 | Mizuno et al. . |
| 4,348,772 | 9/1972 | Leland et al. . |
| 4,451,930 | 5/1984 | Chapman et al. . |
| 4,471,328 | 9/1984 | Chapman . |
| 4,518,922 | 5/1985 | Luecke . |
| 4,527,278 | 7/1985 | Deconche et al. . |
| 4,541,118 | 9/1985 | Eastmond et al. . |
| 4,583,048 | 4/1986 | Gumacos et al. . |

OTHER PUBLICATIONS

Stjernvall et al., "Radio Test Performance of a Narrowband TDMA System", 37th IEEE VTG Conference, Jun. 1-3, 1987, pp. 293-299.
GSM 05.01/3.1.0, "Physical Layer on the Radio Path: General Description", Feb. 15, 1988.
GSM 05.10/1, "Radio Sub-System Synchronization", Jul. 15, 1988.

Primary Examiner—Eugene R. LaRoche
Assistant Examiner—Robert J. Pascal
Attorney, Agent, or Firm—Raymond A. Jenski; Rolland R. Hackbart

[57] ABSTRACT

A frequency control apparatus and method is disclosed in which a frequency offset between a received signal and the local oscillator of a digital receiver is corrected in substantially one step.

43 Claims, 2 Drawing Sheets

FREQUENCY CONTROL APPARATUS AND METHOD FOR A DIGITAL RADIO RECEIVER

BACKGROUND OF THE INVENTION

This invention relates generally to digital radio systems and more particularly to the rapid correction of frequency error in a digital radio receiver which receives communication messages from a transmitter transmitting the communication messages in bursts.

Radio receivers often utilize a circuit to automatically correct for discrepancies in frequency between the carrier frequency of the signal to be received and the frequency of a local oscillator used in a superheterodyne receiver. This local oscillator converts the carrier frequency and associated information carrying sidebands of the received signal to a convenient intermediate frequency. The typical frequency correction process is performed over a relatively long period of time, assuming that the carrier frequency (of the received signal) is continuously present. The carrier frequency may be tracked by means of amplitude detectors, discriminators, or the like to generate a frequency control signal. Some systems may use a pilot signal modulated onto the carrier frequency to provide a reference in the receiver to derive the frequency control signal. (Such a pilot control is further described in U.S. Pat. No. 4,541,118).

The frequency control signal is subsequently applied to the local oscillator from its initial frequency to a frequency which converts the received carrier frequency into an intermediate frequency optimally placed within the selectivity of the intermediate frequency amplification and filtering stages.

Digital receivers present a new set of problems to such conventional automatic frequency control networks. One approach to a fast receiver frequency control for a digital receiver has been disclosed in U.S. patent application No. 285,147, "Digital Automatic Frequency Control on Pure Sine Waves", filed on Dec. 16, 1988 on behalf of Borth et al.

Usually, digital receivers must process the received carrier frequency signal in a linear fashion. Such linear processing allows amplitude variation of the received signal to create further errors in the detection of frequency offset. Furthermore, digital communication is often accomplished using burst transmission techniques such as time division multiple access (TDMA). Burst transmissions do not provide a continuously available carrier or carrier plus pilot which can be employed by conventional frequency control techniques.

SUMMARY OF THE INVENTION

Therefore, it is one object of the present invention to rapidly correct for frequency errors between a received signal and the frequency to which the receiver is tuned in a digital radio receiver.

It is another object of the present invention to rapidly correct a receiver oscillator for frequency errors between a nominal frequency and a desired frequency.

It is another object of the present invention to correct the frequency error between the received signal and the correct receiver local oscillator frequency within a single frame of received data.

It is a further object of the present invention to determine the frequency error from a correction burst and directly correct the local oscillator frequency.

DETAILED DESCRIPTION OF THE PREFERRED EMBODIMENT

Figure 1:
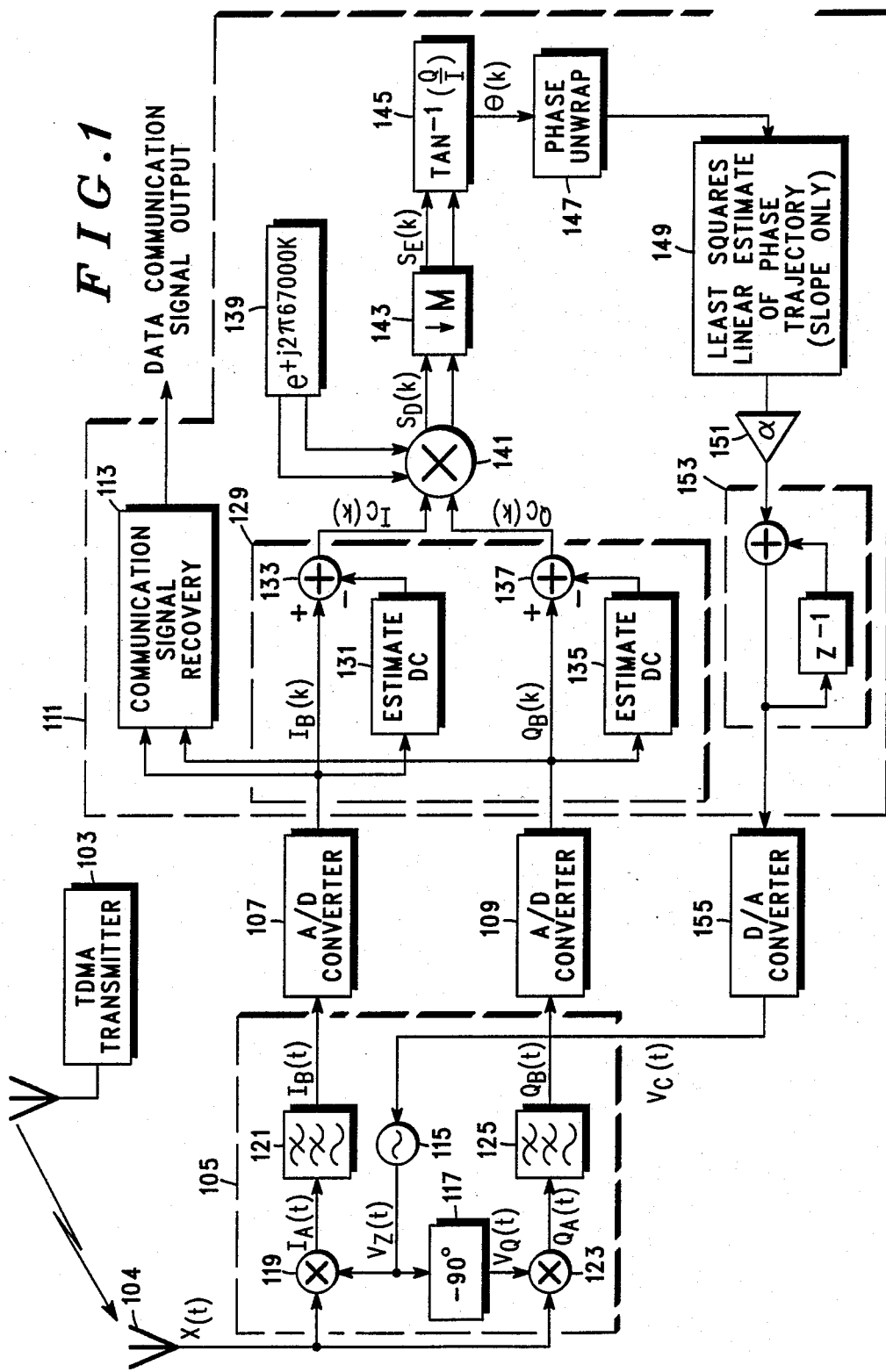
FIG. 1 is a block diagram of a TDMA receiver which may utilize the preent invention.

A block diagram of a TDMA receiver which may utilize the present invention is shown in FIG. 1. Such a receiver may receive burst communication signals in a timeslot from a TDMA transmitter 103 received on an antenna 104 and applied to quadrature demodulator 105 as a signal x(t). The quadrature demodulator 105 produces two quadraturely related downconverted signals which are applied to conventional analog to digital converts 107 and 109 which digitize each of the two quadrature related signals before applying the digitized quadrature signals to a digital signal processor (DSP) function 111. In the preferred embodiment, the DSP is realized employing a DSP65001 available from Motorola, Inc. (or equivalent). The DSP function 111 recovers a data communication signal using conventional TDMA techniques in a communication signal recovery function 113. Such signal recovery functions include channel estimation, channel equalization, and data demodulation. Also included in the DSP function 111 is the recovery of a frequency control signal which allows the rapid adjustment of a voltage controlled oscillator 115 in the quadrature demodulator 105 so that the TDMA receiver can be quickly brought into a condition where there is virtually no frequency error between the carrier frequency of x(t) and the frequency of voltage controlled oscillator 115. Because speed of adjustment is important, it is an important feature of the present invention that the adjustment of the frequency of voltage controlled oscillator 115 be substantially accomplished in one step without oscillator frequency hunting or successive approximations to a final oscillator frequency.

Assume that the transmitted signal corresponding to a frequency correction burst (or pure sine wave (PSW) is given by $$x(t) = A \cos[\omega_c t + \omega_o t] \quad (1)$$

where:

A is the amplitude of the signal, $\omega_c = 2\pi f_c$ is the carrier frequency of the signal in radians/sec;

$\omega_o = 2\pi f_o$ is the PSW baseband signal frequency in radians/sec $= 2\pi(67.708 \ldots \text{kHz})$.

In the absence of multipath noise, Rayleigh fading, etc., the received signal is given by (1). In general, the voltage controlled oscillator 115 (VCXO) frequency without frequency control will be given by $(\omega_c + \Delta\omega)$ where $\Delta\omega$ corresponds to a frequency offset error (in radians/sec). Assume that the VCXO output signal is therefore given by $$v_l(t) = \cos[(\omega_c + \Delta\omega)t]. \quad (2)$$

After phase shifting $v_I(t)$ by $-90°$ in the phase shifter 117, the resulting signal is given by $$v_Q(t) = \sin[(\omega_c + \Delta\omega)t] \quad (3)$$

The output of the in-phase (I) mixer 119 (in the absence of any DC offsets) is given by $$I_A(t) = x(t)v_I(t) = A \cos[\omega_c t + \omega_o t] \cos[(\omega_c + \Delta\omega)t] = \tfrac{1}{2}A\{\cos[(\omega_o - \Delta\omega)t] + \cos[(2\omega_c t + \omega_o\Delta\omega)t]\} \quad (4)$$

which, after low-pass filtering with filter 121 having a bandwidth of approximately 4 $\omega_o$ radians/sec, becomes $$I_B(t) = \tfrac{1}{2}A \cos[(\omega_o - \Delta\omega)t]. \quad (5)$$

Similarly the output of the quadrature-phase (Q) mixer 123 (in the absence of any DC offsets) is given by $$Q_B(t) = x(t)v_Q(t) = A\cos[\omega_c t + \omega_o t]\sin[(\omega_c + \Delta\omega)t] = \tfrac{1}{2}A\{\sin[(2\omega_c t + \omega_o + \Delta\omega)t] - \sin[(\omega_o - \Delta\omega)t]\} \quad (6)$$

which after low-pass filtering by filter 125 becomes $$Q_B(t) = -\tfrac{1}{2}A \sin[(\omega_o - \Delta\omega)t]. \quad (7)$$

The two A/D converters (107, 109) convert $I_B(t)$ and $Q_B(t)$ into their quantized, sampled equivalents, $I_B(k)$ and $Q_B(k)$, respectively. In the absence of any DC offsets: $I_B(k) = I_C(k)$ and $Q_B(k) = Q_C(k)$ Note that direct measurement of the frequency offset $\Delta\omega$ via a frequency counter which counts zero crossings of the signals given in (5) and (7) will yield a measurement uncertainty of freq. uncertainty = 1/measurement period = 1/slot period $$= 1/0.58 \text{ msec} = \pm 1724 \text{ Hz} \quad (8)$$

which corresponds to an uncertainty of $\pm 1.9$ ppm at 900 MHz. In certain radio systems, for example, a digital radiotelephone system for use in Europe defined in GSM documents GSM 05.01/3.1.0, "Physical Layer on the Radio Path: General Description" and GSM 5.10/3, "Radio Sub-System Synchronization", the required stability of the VCXO 115 must be within $\pm 0.1$ ppm of the received signal coming from the base station. Therefore, an approach to measuring frequency errors which does not count zero-crossings must instead by employed. The apparatus and method of the present invention:

(1) translates the I and Q signals given by (5) and (7) by 67.7 kHz to DC (i.e., removes the $\omega_o$ term present in (5) and (7));

(2) computes the phase of the translated signal at regularly spaced time intervals;

(3) constructs the phase trajectory from the phase samples; and (4) computes an estimate of the instantaneous frequency of the frequency-translated signals from the time-derivative of the phase trajectory.

DC Offset Compensation

The DSP function 111 accepts the quantized I/Q signals and processes both the I and the Q signal through a direct current (DC) subtraction process 129. An uncorrected DC offset result of mismatched I and Q channels and local oscillator leakage. An estimate of the DC offset of $I_B(k)$ is made by DC estimate function 131 which averages the input signal the output of which is subtracted from $I_B(k)$ in digital adder 133 thereby producing $I_C(k)$, the I quadrature signal with the DC removed. Likewise, an estimate of the direct current offset is made by DC estimate function 135 of the $Q_B(k)$ signal and subtracted in digital adder 137 to produce $Q_C(k)$, the Q quadrature signal with the DC removed.

In order to implement the above frequency control of the present invention in a fractional fixed point general purpose digital signal processor (DSP) such as the DSP56001, it is necessary to perform several unique steps. Imperfections in an implementation of the quadrature demodulator 105 necessarily results in DC offsets at the output of the quadrature demodulator 105 which must be compensated for in the frequency control.

The presence of DC offsets at the output of the quadrature demodulator 105 can severely limit the performance of the frequency control. To see why this is the case, let $I_B(t)$ and $Q_B(t)$ in (5) and (7) contain DC offset terms of magnitude C and D, respectively. Then $$I_B'(k) = \tfrac{1}{2}A \cos[(\omega_o - \Delta\omega)k] + C \quad (5a)$$

$$Q_B'(k) = -\tfrac{1}{2}A \sin[(\omega_o - \Delta\omega)k] + D \quad (7a)$$

Then after frequency translation by $e^{j\omega_o}k$ as described below $$I_D'(k) = Re\{[S_B(k) + C + jD]e^{j\omega_0 k}\} =$$

$$Re\{[1/2\, A\, e^{-j(\omega_0 - \Delta\omega)k} + C + jD]e^{j\omega_0 k}\} =$$

$$1/2\, A \cos \Delta\omega k + C \cos \omega_0 k - D \sin \omega$$

$$Q_D'(k) = Im\{[S_B(k) + C + jD]e^{j\omega_0 k}\} =$$

$$Im\{[1/2\, A\, e^{-j(\omega_0 - \Delta\omega)k} + C + jD]e^{j\omega_0 k}\} =$$

$$1/2\, A \sin \Delta\omega k + C \sin \omega_0 k + D \cos \omega_0 k.$$

The presence of the two quadrature components at a frequency $\omega_o$ prevent further downsampling (or decimation) without introducing aliasing errors and can contribute to a significant error in the computation of $\tan^{-1}(Q_E(k)/I_E(k))$ in (13) below. Removal of the two undesired frequency components in (17) below can be accomplished by two methods:

(1) Low-pass filtering of $I_D'(k)$ and $Q_D'(k)$ to remove the $\sin \omega_0 k$ and $\cos \omega_0 k$ components; or (2) Removal of the DC components prior to frequency translation by $e^{j\omega_o k}$.

The first approach requires a low-pass filter with a bandwidth less than $f_0/10 = 6.7$ kHz, for example, and thus having an impulse response of duration greater than $5/6.7$ kHz = 0.73 msec, for example, an impulse response duration greater than the duration of a single time slot. Clearly this is an unacceptable approach.

The second approach simply computes the average DC value of the two quadrature branches separately and subtracts these values from the respective branch signals:

$$I_C(k) = I_B(k) - 1/J \sum_{k=1}^{J} I_B(k)$$

$$Q_C(k) = Q_B(k) - 1/J \sum_{k=1}^{J} Q_B(k)$$

Frequency translation by 67.7 KHz.

A TDMA receiver compatible with GSM specifications such as those mentioned above utilizes a frequency correction signal which is transmitted as a carrier shift of exactly 67.7 KHz during one timeslot of the TDMA transmission. A frequency translation of the I quadrature channel signal and the Q channel quadrature signal by 67.7 KHz accomplishes the following result. The signal is translated to 0 Hz$\pm\Delta\omega/2\pi$ thereby reducing the information data rate and permitting further decimation.

This is accomplished by a quantized 67.7 kHz signal in quadrature, as generated by 67.7 kHz oscillator 139. Translation is accomplished by complex quadrature mixer 141, which is a complex multiplication realized in the DSP.

Let

Let $$S_C(k) = I_C(k) + jQ_C(k) = 1/2\, Ae^{-j(\omega_0 - \Delta\omega)k} \quad (9)$$

where $I_C(k)$ and $Q_C(k)$ are given above. After multiplication of $S_C(k)$ by $e^{j\omega_0 k}$, we obtain $$S_D(k) = I_D(k) + jQ_D(k) = 1/2\, A\{e^{j\Delta\omega k}\} = \quad (10)$$

$$1/2\, A\cos\Delta\omega k + j\, 1/2\, A\sin\Delta\omega k$$

In the preferred embodiment, the TDMA modulation is conventionally processed by the transmitter in a manner known as GMSK which limkts the occupied bandwidth of the transmitted signal. Since $\Delta\omega$ will generally be small compared to the information bandwidth of the transmitted GMSK signal with random data (i.e., a normal burst instead of a frequency correction burst), $S_D(k)$ may be decimated by a factor of M to reduce the signal processing complexity required for frequency control without reducing control accuracy. The decimated signal $S_E(k)$ is obtained from $S_D(k)$ by the operation $$S_E(k) = S_D(Mk) \quad (12)$$

which is accomplished in function 143, a conventional decimator. Thus, the M−1 samples of $S_D(k)$ between valid samples of $S_E(k)$ are simply deleted.

Computation of the phase of the decimated, translated signal.

In accordance with known trigonometric identities, a calculation of the phase relationship between the VCXO 115 output signal and x(t) can be made employing the decimated and translated I and Q signal samples. This phase relationship may be expressed as $\theta(k)$ for the k-th decimated sample period. The phase samples $\theta(k)$ are computed from $S_E(k)$ via the operation $$\theta(k) = \tan^{-1}(Q_E(k)/I_E(k)) = \quad (13)$$

$$\tan^{-1}(\sin\Delta\omega k/\cos\Delta\omega k) =$$

$$\tan^{-1}(\tan(\Delta\omega k)) =$$

$$\Delta\omega k$$

where the time interval of k is understood to be the decimated period.

Three problems arise in calculating $\tan^{-1}(Q_E(k)/I_E(k))$ in (13):

1. Division of $Q_E(k)$ by $I_E(k)$ on a fractional fixed point machine is limited to the case where $I_E(k) > Q_E(k) \geq 0$.

2. $\tan^{-1}(x)$ is an inverse transcendental function requiring either a Taylor series expansion or a table-lookup.

3. The valid range of $\tan^{-1}(Q_E(k)/I_E(k))$ extends beyond $\pm 180°$ after phase unwrapping and hence the $\tan^{-1}$ function must be scaled appropriately for a fixed point machine.

All three problems may be solved by:

(a) Using a small (256 word) ROM arctangent table over the range [0,45°]. To use the table, a short (8 instruction cycle) division of $Q_E(k)$ by $I_E(k)$ is required to yield an 8 bit ROM table address. Note that over the actangent ROM table range, the inequality $I_E(k) > Q_E(k) \geq 0$ is preserved.

(b) Extending the range of the arctangent table to $\pm 180°$ by (i) preserving the signs of $Q_E(k)$ and $I_E(k)$;

(ii) noting whether $|I_E(k)| > |Q_E(k)|$ or vice versa; and (iii) using a precomputed table of trigonometric identities to compute the arctangent function in each of the 4 quadrants.

(c) Scaling the ROM table values to the largest possible range of the unwrapped phase $\theta_o(k)$. This range is given by $\pm V = \pm$[maximum allowable frequency error (Hz).duration of 1 time slot (sec).360° + 180°] For example, with a VCXO 115 stability of $\pm 2.5$ ppm at 1 GHz, the maximum allowable frequency error is $\pm 2.5$ kHz and the phase range of $\theta_o(k)$ is given by $$\pm[(2.5\text{ kHz})(0.58\text{ msec})360° + 180°] =$$

$$\pm 702° = \pm V.$$

All phase values must therefore be scaled by $V = 702°$ to prevent overflow in the phase unwrapping algorithm.

Construction of the phase trajectory from the phase samples.

Provided that the signs of $I_E(k)$ and $Q_E(k)$ are preserved, $\tan^{-1}(Q_E(k)/I_E(k))$ is defined only over the internal $[-\pi, \pi]$, or equivalently only over the interval $[-180°, 180°]$. Since absolute phase is not known in the frequency control process, any given sample of $S_E(k)$ will yield a phase sample $\theta(k)$ within this range. For example, if the output of the phase computation of $\theta(k)$ is used directly as the phase trajectory, and if $\theta(1) = 179°, \theta(2) = -179°, \theta(3) = -177°, \ldots$, then determination of the instantaneous frequency offset via time differentiation of the phase trajectory of $\theta(k)$ would yield ambiguous results due to the apparent $-358°$ phase jump between $\theta(1)$ and $\theta(2)$. In fact, if the phase were "unwrapped" in this example by allowing the phase samples to take on values outside the range $\pm 180°$, it becomes obvious that the phase samples are increasing by $+2°$ every phase sample.

Figure 2:
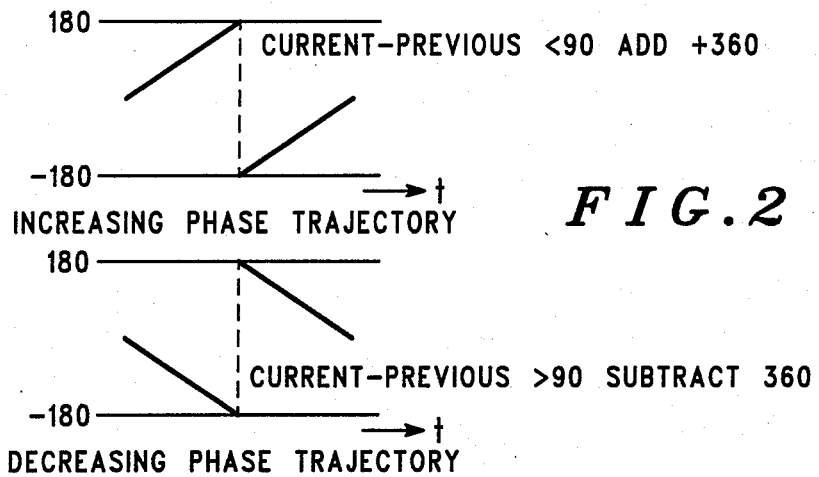
FIG. 2 shows the unwrapping process for both an increasing phase trajectory and a decreasing phase trajectory.

In order to unwrap the phase samples, a phase unwrap process 147 is employed in the DSP of the present invention. Conceptually, the unwrapping process for both an increasing phase trajectory and a decreasing phase trajectory is shown in FIG. 2 and is accomplished by the following steps which are performed by the DSP 111 of the present invention:

Initialization:     $\theta(k)$, k=1, ..., N from Step 2

```
        Previous = θ(1)
        Sumphase = 0
        Threshold = 90°
    DO k = 2 to N
        Current = θ(k) + Sumphase
        IF (|(Current − Previous)| < Threshold)THEN
            θ₀(k) = θ(k)
            Previous = θ₀(k) (No phase jump)
        ELSE IF ((Current−Previous)< − Threshold)
THEN
            Sumphase = Sumphase + 360°
            θ₀(k) = Current + 360°
            Previous = θ₀(k) (−360° phase jump)
        ELSE
            Sumphase = Sumphase − 360°
            θ₀(k) = Current − 360°
            Previous = θ₀(k) (+360° phase jump)
        END IF
    END DO
```

The array of unwrapped phase points $\theta_o(k)$, $k\epsilon[1,N]$ are employed in subsequent computation of the instantaneous frequency offset. Note that the unwrapped phase samples $\theta_o(k)$ are just the values $\Delta\omega k$ given by (13) where $\Delta\omega k$ may now take on any value (including values outside the interval [−180°, 180°]).

Computation of the instantaneous frequency of the frequency-translated signals from the time-derivative of the phase trajectory.

In the absence of any noise, quantization, or frequency instability, the instantaneous frequency error may be calculated from (13) using just the difference between any two phase samples. In practice, all of these impairments result in measurement errors from employing just two samples. Instead a least-squares linear fit to the phase trajectory is employed. The slope of such a least-squares linear fit curve is then proportional to the instantaneous frequency. From M. Schwartz and L. Shaw *Signal Processing: Discrete Spectral Analysis, Detection, and Estimation*, McGraw-Hill, 1975, pp. 14–15, the slope (S) of the least-square linear fit line to a set of $2N+1$ data points $\theta_o(-N), \ldots \theta_o(0), \ldots \theta_o(N)$ is given by the following calculation performed by function 149:

$$S = \frac{\sum_{n=-N}^{N} n\theta_o(n)}{\sum_{n=-N}^{N} n^2} \quad (14)$$

Assume $\theta_o(n)$ has the units of degrees. The instantaneous frequency error is therefore given by $$f_{error}(Hz) = d\theta/dt = S/360N \cdot L \cdot 270.833 \times 10^3 \quad (15)$$

where L is the oversampling factor employed by the A/D converters 107 and 109; i.e., the A/D sampling rate is $L \cdot 270.833 \times 10^3$ samples/sec. It is important to note that the frequency error is (a) independent of the input amplitude A and (b) can be calibrated directly in terms of Hz (see (15)).

After multiplication of the frequency error, given by (15), by the loop gain constant α in amplifier function 151 and integrating this result in conventioal integrator 153, the integrator output is converted to an analog voltage $V_c(t)$ by D/A converter 155. The D/A converter 155 output analog voltage $V_c(t)$ drives the VCXO 115, thereby closing the frequency control loop.

With proper selection of the loop gain constant a and knowledge of the VCXO Hz/volt gain constant, it is possible to lock the loop in just one time frame duration of the TDMA signal since the frequency error given by (15) may be directly calibrated in Hertz.

Generally speaking, the larger the number of phase sample points employed in the least-squares linear fit algorithm, the smaller the calculated frequency measurement error. However, a large number of data points also requires a large amount of computation. To study the tradeoff between complexity and frequency measurement accuracy, a number of computer simulations were run in which (a) the frequency offset was varied between ±500 Hz in increments of 1.95 Hz with one time slot of data at each frequency step, (b) different values of the decimation factor (M) and the number of measured data points employed in the least-squares linear fit algorithm were varied, keeping the product $(2N+1)(M)\cong 800$ so that the same span of data points were used in each case.

A summary of these three simulations is given below.

| Simulation | M | N | 2N + 1 | Absolute Frequency Error |
|---|---|---|---|---|
| 1. | 1 | 398 | 797 | 1 Hz |
| 2. | 20 | 19 | 39 | 11 Hz |
| 3. | 40 | 9 | 19 | 27 Hz |

Figure 3:
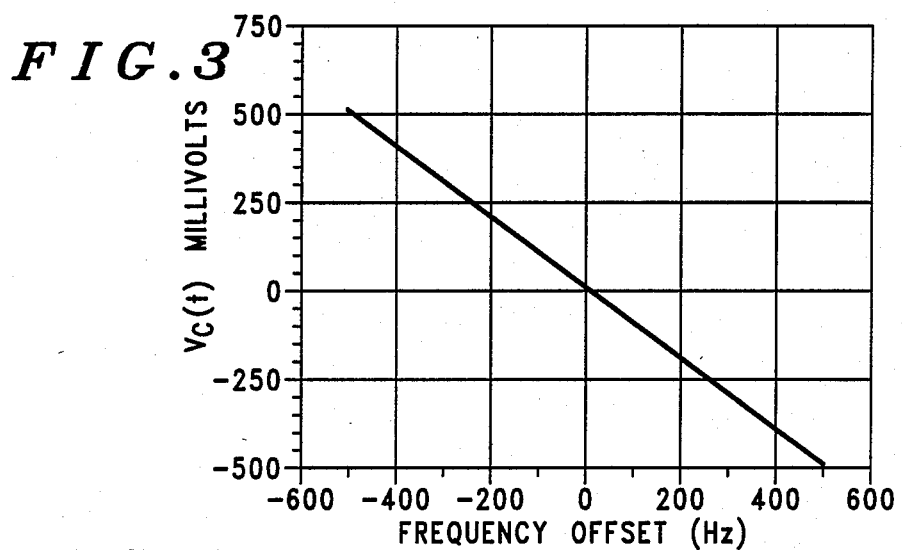
FIG. 3 shows the result of a computer simulation.

Since a conventional 8 bit D/A converter 155 is employed in the frequency control loop and the stability of VCXO 115 is ±2.5 ppm at 1 GHz implying an error step size of 19.5 Hz, the values of N and M employed in simulation 2 will result in a frequency measurement error of approximately ½ LSB of the D/A 155 referenced to the VCXO 115 stability. The result of simulation 2 is shown in FIG. 3 in which $V_c(t)$ is plotted as a function of frequency offset.

Note that once N is selected, the denominator in (14) can be pre-computed. For expediency, the denominator used in (14) can be selected to speed the frequency measurement process by selecting the denominator W to be a power of 2, i.e., let $$S' = \sum_{n=-N}^{N} n^2 S/W.$$

Using the above-defined constants in (15), the expression for the instantaneous frequency error in terms of the measured parameter S' is $$f_{error}(Hz) = S'/(360 \cdot N) \cdot L \cdot 270.8333 \times 10^3 \cdot W/V$$

$$\sum_{n=-N}^{N} n^2$$

In the preferred embodiment, $$M = 20 \quad W = 512$$
$$L = 8 \quad V = 2048$$
$$N = 19 \quad \sum_{n=-N}^{N} n^2 = 4940$$

and thus $$f_{error}(Hz) = 63,875 \cdot S'.$$

Figure 4:
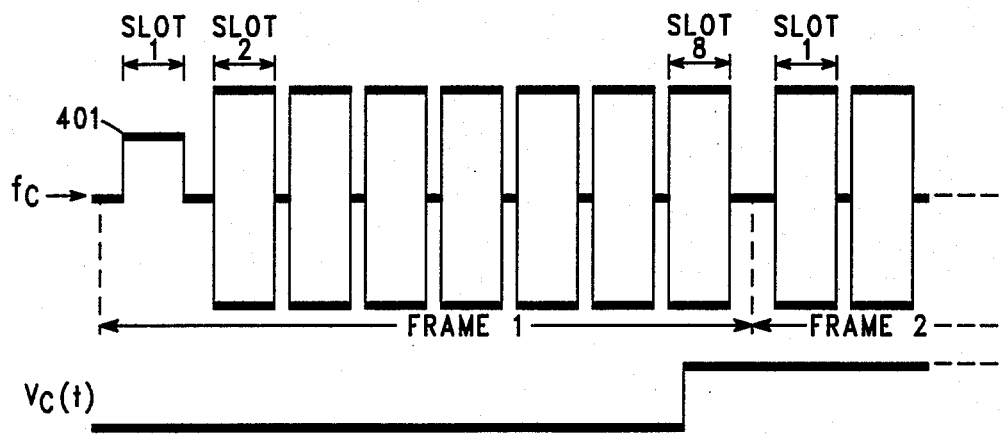
FIG. 4 shows a timing diagram relating the burst TDMA transmissions to the frequency control of the present invention.

A system which would employ a receiver employing the present invention is that which is specified for the Pan-European System in the aforementioned GSM documents. A timing diagram shown in FIG. 4 relates the burst TDMA transmissions to the frequency control of the present invention. In the exemplary transmission shown in FIG. 4 one transmission frame and part of a second transmission frame illustrated as blocks of information transmission conveyed as frequency excursions about a center carrier frequency ($f_c$). Each of these information blocks are conventional TDMA timeslots, each timeslot conveying information to a selected different receiver. In the preferred embodiment each frame lasts for a duration of time equal to 4.6 ms. and each timeslot lasts for a time duration of 0.58 ms.

In order to convey a frequency correction signal from the transmitter to the various receivers, the preferred embodiment employs a distinct carrier frequency shift during a predetermined timeslot, such as that shown at 401. (This carrier shift has come to be called a "pure sine wave" (PSW)). The carrier shift is equal to 13 MHz/192$\approx$67.708 kHz (within a tolerance range of $\pm 0.05$ ppm$= \pm 0.00338$ Hz). Regular TDMA communications may occur in subsequent timeslots, as indicated. The PSW need not be transmitted during each frame; the preferred embodiment transmits the PSW at a rate of approximately 21 times per second.

The frequency control of the present invention processes the PSW as described previously. Upon receipt of the PSW, the curve relating frequency offset (in Hertz) to the required frequency control signal (in millivolts) is interrogated based on the value of frequency offset calculated by the phase trajectory computation. The single value of control signal ($V_c(t)$) corresponding to the frequency offset is determined. This singular control signal value is input to the VCXO 115 as a single step that places the VCXO frequency within 0.03 parts per million of the carrier frequency of the transmitted TDMA signal. This singular control signal value is maintained for the duration of the frames of signal until the next PSW is received. In this way, a rapid and accurate correction of frequency between the transmitted carrier frequency and the received frequency is obtained.

We claim:

1. A frequency control apparatus for a burst-mode radio communications system employing a frequency correction signal transmitted as a burst to enable correction of frequency differences between the frequency of the radio carrier of a subsequent communication bursgt and the frequency of reception by a radio receiver, the frequency control apparatus comprising:
   means, including a variable frequency oscillator, for receiving a frequency correction signal burst and for processing a communication burst having a frequency difference between said variable frequency oscillator and the radio carrier frequency of said communication burst; and
   means, coupled to said means for receiving said frequency correction signal burst, for generating a singular control signal value and for applying said singular control signal value to said variable frequency oscillator to correct said frequency difference.

2. A frequency control apparatus in accordance with claim 1 wherein said means for generating further comprises means for calculating at least one phase magnitude related to said frequency difference.

3. A frequency control apparatus in accordance with claim 2 wherein said means for processing a communication burst further comprises means for converting said frequency correction signal burst into I and Q quadrature frequency correction burst signals.

4. A frequency control apparatus in accordance with claim 3 wherein said means for generating further comprises means for translating the frequency of at least some of said I and Q quadrature frequency correction burst signals by a predetermined frequency.

5. A frequency control apparatus in accordance with claim 3 wherein said means for generating further comprises means for sampling said I and Q quadrature frequency correction burst signals to generate I and Q correction signal samples.

6. A frequency control apparatus in accordance with claim 5 wherein said means for generating further comprises means for generating a phase trajectory from at least some of said I and Q correction signal samples.

7. A frequency control apparatus in accordance with claim 6 wherein said means for calculating at least one phase magnitude further comprises means for calculating the arctangent of the quotient of a Q correction signal sample divided by an I correction signal sample.

8. A frequency control apparatus in accordance with claim 7 wherein said means for generating a phase trajectory further comprises means for calculating a least squares linear fit curve of a first calculation of an arctangent to a second calculation of an arctangent, thereby producing a frequency difference versus control signal value relationship from which one singular control signal value for each frequency difference is derived.

9. A frequency control apparatus in accordance with claim 3 wherein said means for generating further comprises means for compensating a direct current offset.

10. A frequency control apparatus in accordance with claim 1 wherein said means for generating further comprises means for producing a frequency difference versus control signal value relationship from which one singular control signal value for each frequency difference is derived.

11. A frequency control apparatus in accordance with claim 10 wherein said means for generating and applying said singular control signal value to correct said frequency difference applies said singular control signal value within one frame of a plurality of communication bursts.

12. A frequency control apparatus in accordance with claim 11 wherein said frame has a time duration of less than 5 milliseconds.

13. A frequency control apparatus in accordance with claim 1 wherein said means for generating is independent of amplitude of said frequency correction signal burst.

14. An automatic frequency adjustment circuit for a radio comprising:
   oscillator means for producing a signal at a predetermined nominal frequency,
   means for receiving a communications signal at substantially the frequency of the oscillator means, and a reference signal having a fixed frequency offset to the communications signal frequency, and
   digital means responsive to the reference signal to produce a correction signal to the oscillator means, to cause the oscillator means to produce a signal at the frequency of the communications signal.

15. An automatic frequency adjustment circuit as set forth in claim 14 wherein the means for producing a correction signal comprises means for digitally generating a calibrated S-curve of a correction value as a function of the frequency offset.

16. An automatic frequency adjustment circuit as set forth in claim 15 whereby the correction signal is substantially insensitive to amplitude variations of the reference signal.

17. An automatic frequency adjustment circuit as set forth in claim 14 wherein the correction signal substantially completely causes the oscillator means to produce a signal at the frequency of the communications signal in one step.

18. An automatic frequency adjustment circuit as set forth in claim 14 wherein the correction signal substantially completely causes the oscillator means to produce a signal at the frequency of the communications signal within ten seconds.

19. An automatic frequency adjustment circuit as set forth in claim 14 wherein the correction signal substantially completely causes the oscillator means to produce a signal at the frequency of the communications signal within ten system frames.

20. An automatic frequency adjustment circuit as set forth in claim 14 wherein the correction signal substantially completely causes the oscillator means to produce a signal at the frequency of the communications signal within one system frame.

21. An automatic frequency adjustment circuit as set forth in claim 14 wherein the correction signal causes the oscillator means to produce a signal within one part per million of the frequency of the communications signal in one step.

22. An automatic frequency adjustment circuit as set forth in claim 14 wherein the correction signal causes the oscillator means to produce a signal within one part per million of the frequency of the communications signal within ten seconds.

23. An automatic frequency adjustment circuit as set forth in claim 14 wherein the correction signal causes the oscillator means to produce a signal within one part per million of the frequency of the communications signal within ten system frames.

24. An automatic frequency adjustment circuit as set forth in claim 14 wherein the correction signal causes the oscillator means to produce a signal within one part per million of the frequency of the communications signal within one system frame.

25. An automatic frequency control circuit for a radio comprising:
   an oscillator for producing an output signal approximately at a predetermined nominal frequency,
   means for receiving a signal of a predetermined frequency which is a fixed offset from a carrier frequency,
   means coupled to the means for receiving for demodulating the reference signal,
   means coupled to the means for demodulating for converting the demodulated signal into a digital signal representative thereof, and
   digital processing means responsive to the digital signal for producing a correction signal to cause the oscillator to produce an output signal at the carrier frequency.

26. An automatic frequency control circuit as set forth in claim 25 wherein the correction signal is produced within ten seconds of receipt of the reference signal.

27. An automatic frequency control circuit as set forth in claim 25 wherein the correction signal is produced within ten system frames.

28. An automatic frequency control circuit for a radio comprising:
   an oscillator for producing an output signal approximately at a predetermined nominal frequency,
   digital processor means for processing communications signals at high speed,
   means for receiving a signal of a predetermined frequency which is a fixed offset from a carrier frequency,
   means coupled to the means for receiving for demodulating the reference signal,
   means coupled to the means for demodulating for converting the demodulated signal into a digital signal representative thereof,
   the digital processing means being additionally responsive to the digital signal for producing a correction signal to cause the oscillator to produce an output signal at the carrier frequency.

29. An automatic frequency control circuit for a radio as set forth in claim 28 wherein the correction signal is produced within ten seconds of receipt of the reference signal.

30. An automatic frequency control circuit as set forth in claim 28 wherein the correction signal is produced within ten system frames.

31. An automatic frequency adjustment circuit as set forth in claim 28 wherein the correction signal causes the oscillator means to produce a signal within one part per million of the frequency of the communications signal in one step.

32. An automatic frequency adjustment circuit as set forth in claim 28 wherein the correction signal causes the oscillator means to produce a signal within one part per million of the frequency of the communications signal within ten seconds.

33. An automatic frequency adjustment circuit as set forth in claim 28 wherein the correction signal causes the oscillator means to produce a signal within one part per million of the frequency of the communications signal within ten system frames.

34. A method of frequency control for a receiver in a burst-mode radio communications system employing a frequency correction signal transmitted as a burst to enable correction of frequency differences between the frequency of the radio carrier of a subsequent communication burst and the frequency of reception by the radio receiver, the method of frequency control comprising the steps of:
   receiving a frequency correction signal burst and processing a communication burst having a frequency difference between a variable frequency oscillator and the radio carrier frequency of said communication burst; and
   generating a singular control signal value in response to said receiving of said frequency correction signal burst and for applying said singular control signal value to said variable frequency oscillator to correct said frequency difference.

35. A method in accordance with the method of claim 34 wherein said generating step further comprises the step of calculating at least one phase magnitude related to said frequency difference.

36. A method in accordance with claim 34 wherein said processing a communication burst step further comprises the step of converting said frequency correction signal burst into I and Q quadrature frequency correction burst signals.

37. A method in accordance with the method of claim 36 wherein said generating step further comprises the step of translating the frequency of at least some of said I and Q quadrature frequency correction burst signals by a predetermined frequency.

38. A method in accordance with the method of claim 36 wherein said generating step further comprises the step of sampling said I and Q quadrature frequency correction burst signals to generate I and Q correction signal samples.

39. A method in accordance with the method of claim 38 wherein said generating step further comprises the step of generating a phase trajectory from at least some of said I and Q correction signal samples.

40. A method in accordance with the method of claim 39 wherein said calculating at lest one phase magnitude step further comprises the step of calculating the arctangent of the quotient of a Q correction signal sample divided by an I correction signal sample.

41. A method in accordance with the method of claim 40 wherein said generating a phase trajectory step further comprises the step of calculating a least squares linear fit curve of a first calculation of an arctangent to a second calculation of an arctangent, thereby producing a frequency difference versus control signal value relationship from which one singular control signal value for each frequency difference is derived.

42. A method in accordance with the method of claim 3 wherein said generating step further comprises the step of compensating a direct current offset.

43. A method in accordance with the method of claim 34 wherein said generating step further comprises the step of producing a frequency difference versus control signal value relationship from which one singular control signal value for each frequency difference is derived.

* * * * *